US006535447B2

(12) United States Patent
Kim et al.

(10) Patent No.: US 6,535,447 B2
(45) Date of Patent: Mar. 18, 2003

(54) SEMICONDUCTOR MEMORY DEVICE AND VOLTAGE LEVEL CONTROL METHOD THEREOF

(75) Inventors: Hyung-Dong Kim, Gyeonggi-do (KR); Kwang-Hyun Kim, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/000,178

(22) Filed: Nov. 30, 2001

(65) Prior Publication Data

US 2002/0064078 A1 May 30, 2002

(30) Foreign Application Priority Data

Nov. 30, 2000 (KR) .......................................... 00-71976

(51) Int. Cl.[7] .................................................. G11C 7/00

(52) U.S. Cl. ..................... 365/226; 365/201; 365/225.7

(58) Field of Search ................................ 365/226, 200, 365/201, 225.7

(56) References Cited

U.S. PATENT DOCUMENTS 5,553,021 A * 9/1996 Kubono et al. ............. 365/226
5,966,339 A * 10/1999 Hsu et al. ................... 365/201
6,094,395 A * 7/2000 Weinfurtner ................ 365/226
6,381,188 B1 * 4/2002 Choi et al. ............... 365/225.7

* cited by examiner

*Primary Examiner*—Trong Phan
(74) *Attorney, Agent, or Firm*—Marger Johnson & McCollom P.C.

(57) ABSTRACT

The present invention discloses a semiconductor memory device and a voltage level control method thereof. The semiconductor memory device comprises multiple sub high voltage generators, multiple control circuits, a high voltage level detecting circuit, and a mode setting circuit. The multiple sub high voltage generators boost the high voltage level. The multiple control circuits control operations of each of the corresponding multiple sub high voltage generators responsive to each of corresponding high voltage detecting signals and to each of corresponding multiple control signals in the test mode. The high voltage level detecting circuit enabled by an active signal, detects the level drop of a high voltage and generates the high voltage detecting signal. The mode setting circuit sets the state of the multiple control signals responsive to the signals from the out side in the test mode. Performing the test by regulating the number of the multiple sub high voltage generators can prevent the semiconductor memory device from over kill. In addition, the test of the package state can be performed by enabling a few of the voltage generators than necessary for the full operation of the test mode.

10 Claims, 5 Drawing Sheets

SEMICONDUCTOR MEMORY DEVICE AND VOLTAGE LEVEL CONTROL METHOD THEREOF

RELATED APPLICATION DATA

This application claims the benefit of Korean Patent Application No. 2000-71976, filed on Nov. 30, 2000, under 35 U.S.C. §119, the entirety of which is hereby incorporated by reference.

BACKGROUND OF THE INVENTION

1. Field of the Invention

The present invention relates to a semiconductor memory device and, more particularly, to a semiconductor memory device including voltage generators and a voltage level control method thereof.

2. Description of Related Art

The conventional semiconductor memory device turns on an NMOS transistor responsive to a signal applied from a word line and transmits a data between a memory cell and a bit line. The NMOS transistor normally can not transmit a sufficiently high logic level data between the memory cell and the bit line because the NMOS transistor loses an amount of threshold voltage in transmitting the high logic level data.

To address this problem, semiconductor memory devices usually include a high voltage generator for generating a higher voltage than a power supplying voltage. The high voltage generator enables a word line with the higher voltage.

The high voltage generator in the semiconductor memory device comprises a main high voltage generator operating in both a stand-by and an active mode, and a sub high voltage generator operating only in the active mode.

A normal mode includes both stand-by and active modes, as well as a test mode. The standby mode refers to waiting for any activation of the semiconductor memory device. The active mode refers to activating the semiconductor memory device. The test mode refers to testing the semiconductor memory device after its manufacture and before shipment.

Because a high voltage level drop in the active mode is higher than that in a standby mode, both the main high voltage generator and the sub high voltage generator operate to compensate the level drop of the high voltage level.

When two sub high voltage generators are necessary to enable one word line in the active mode and the semiconductor memory device enters a test mode by enabling four word lines simultaneously, eight sub high voltage generators are necessary. Put differently, when N number of sub high voltage generators are necessary to enable one word line in the normal mode, 4N number of sub high voltage generators are necessary to enable four word lines in the test mode.

Each of the 4N sub high voltage generators is designed by calculating not an ideal but an experimental electric charge and by allowing a little bit of margin to this experimental electric charge. Therefore, the total electric charge of the 4N sub high voltage generators designed in the semiconductor memory device are normally higher than those of an ideal 4N sub high voltage generator. In the normal mode, operating all of the sub high voltage generators is a very rare case such that the sum of applied electric charges is not too high. In the test mode, however, all 4N sub high voltage generators operate resulting in the sum of applied electric charges to be higher than those in the normal mode. The result is that the high voltage level drop does not occur in the case of all 4N sub high voltage generators being fully operational in the test mode of a semiconductor memory device.

High voltage oversupply by the 4N sub high voltage generators can cause a normal semiconductor memory device to be tagged as a failing device by causing a defect error due to the over kill phenomena in the test mode. The conventional semiconductor memory device, therefore, does not have any method to control the number of operational sub high voltage generators in the test mode and cannot verify the necessary number of sub high voltage generators.

The above described problem can occur not only in the high voltage generators, but also in other voltage generators.

SUMMARY OF THE INVENTION

It is an object of the present invention to overcome the problems associated with prior art semiconductor memory devices.

It is another object to provide a semiconductor memory device that can control the number of sub high voltage generators necessary in both the test and normal modes.

It is yet another object to provide a voltage level control method in the semiconductor memory device for controlling the number of sub high voltage generators necessary in both the test and normal modes.

An embodiment of the semiconductor memory device comprises multiple sub high voltage generators, multiple control apparatus, high voltage level detecting apparatus, and mode setting apparatus. The multiple sub high voltage generators boost the high voltage level. The multiple control apparatus control the corresponding multiple sub high voltage generators responsive to corresponding high voltage detecting signals and to corresponding multiple control signals in the test mode. The high voltage level detecting apparatus enabled by an active signal detects the level drop of a high voltage and generates the high voltage detecting signal. The mode setting apparatus set the state of the multiple control signals responsive to external signals in the test mode.

Another embodiment of the semiconductor memory device comprises multiple voltage generators, multiple control apparatus, voltage level detecting apparatus, and mode setting apparatus. The multiple voltage generators boost the voltage level. The multiple control apparatus control operations of the corresponding multiple voltage generators responsive to corresponding voltage detecting signals and corresponding multiple control signals in the test mode. The voltage level detecting apparatus detect the voltage level drop and generate the voltage detecting signal. The mode setting apparatus sets the state of the multiple control signals responsive to the mode setting control signals in the test mode.

A voltage level control method for a semiconductor memory device is also provided. The voltage level control method comprises applying multiple control signals of the multiple voltage generators from the mode setting apparatus in the test mode of the package state, and operating multiple voltage generators for performing the test responsive to the multiple control signals.

BRIEF DESCRIPTION OF THE DRAWINGS

For a more complete understanding of the present invention and the advantages thereof, references are now made to the following descriptions taken in conjunction with the accompanying drawings, in which like reference numerals denote like parts.

DETAILED DESCRIPTION OF PREFERRED EMBODIMENT(S)

Reference will now be made in detail to preferred embodiments according to the present invention, examples of which are illustrated in the accompanying drawings. The following describes a high voltage generator before describing a semiconductor memory device and a voltage level control method according to the present invention.

Figure 1:
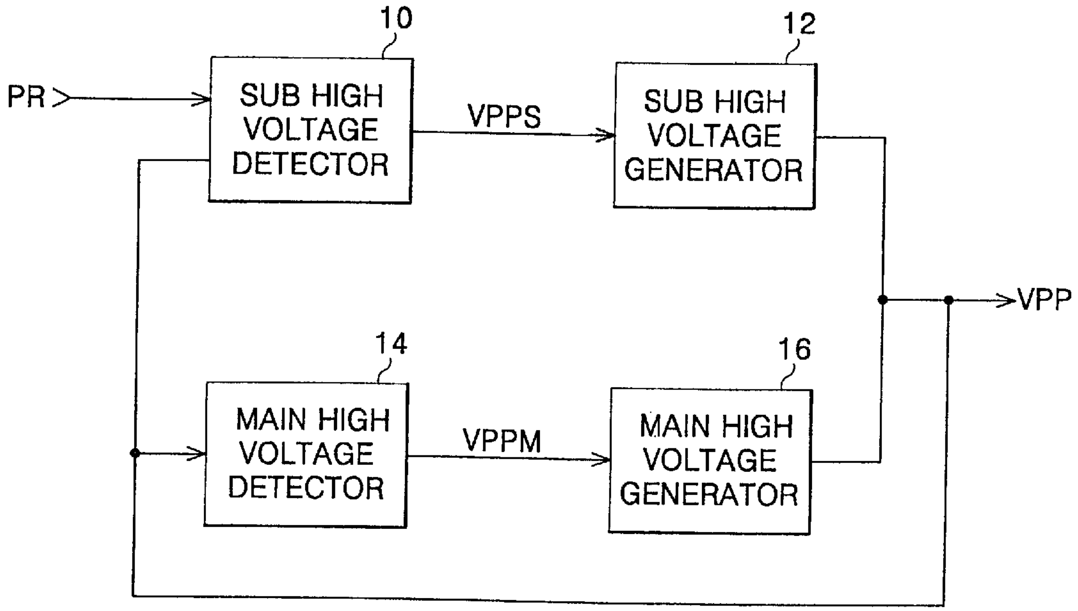
FIG. 1 is a block diagram illustrating a high voltage generator in a semiconductor memory device.

FIG. 1 is a block diagram of a high voltage generator in a semiconductor memory device. The high voltage generator comprises a sub high voltage detector 10, a sub high voltage generator 12, a main high voltage detector 14, and a main high voltage generator 16.

The sub high voltage detector 10 detects a level drop in the high voltage VPP in response to an active signal PR in an active mode and generates a sub high voltage detecting signal VPPS. The sub high voltage generator 12 boosts the high voltage VPP responsive to the sub high voltage detecting signal VPPS. The main high voltage detector 14 detects the level drop in the high voltage VPP in the stand-by and active modes, and generates a main high voltage detecting signal VPPM. The main high voltage generator 16 boosts the high voltage VPP responsive to the main high voltage detecting signal VPPM.

Figure 2:
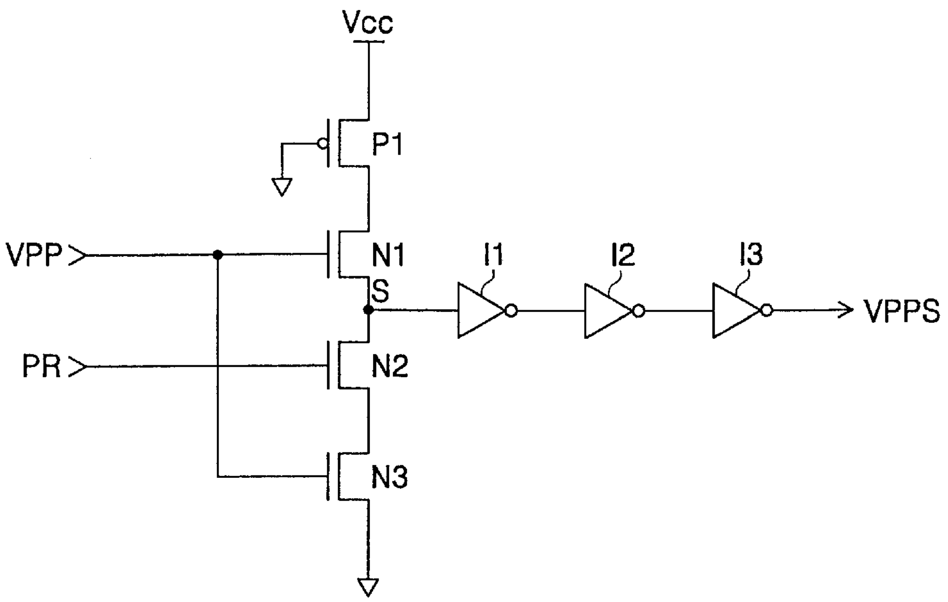
FIG. 2 is a circuit diagram of the sub high voltage detector shown in FIG. 1.

FIG. 2 is a circuit diagram of the sub high voltage detector 10 shown in FIG. 1. The sub high voltage detector 10 comprises a PMOS transistor P1, NMOS transistors N1, N2, and N3, and inverters I1, I2, and I3. The PMOS transistor P1 and the NMOS transistor N1 are serially connected between a power voltage VCC and a node S. A gate of the PMOS transistor P1 receives a ground voltage Vss and a gate of the NMOS transistor N1 receives the high voltage VPP. The NMOS transistors N2 and N3 are serially connected between the node S and the ground voltage Vss. A gate of the NMOS transistor N2 receives the active signal PR. A gate of the NMOS transistor N3 receives the high voltage VPP. Three serially connected inverters I1, I2, and I3 buffer a signal at node S and generate the sub high voltage detecting signal VPPS.

The circuit of FIG. 2 operates as follows. The active signal PR turns on the NMOS transistor N2 and enables an operation of the sub high voltage detector 10. The voltage at node S is expressed as (R3+R4) VCC/(R1+R2+R3+R4), wherein resistances R1, R2, R3, and R4 is a resistance of the PMOS transistor P1 and the NMOS transistors N1, N2, and N3, respectively. However, because the PMOS transistor P1 operates in a saturation area as a current source, the value of the resistance R1 can be ignored. Therefore, the voltage at node S can be expressed as (R3+R4) VCC/(R2+R3+R4). The value of the resistance R3 is fixed in the active mode, thus, the voltage of the node S is changed according to the change of the high voltage VPP applied to gates of NMOS transistors N1 and N3.

As a result, the high voltage VPP applied to the gates of NMOS transistors N1 and N3 is maintained at a high voltage level and the resistance values of resistances R2 and R4 are reduced. Referring to the above equation, the resistance value by both resistances R2 and R4 is decreased more than that by R4 alone, and the voltage at node S is increased. The inverter I1 recognizes the voltage generated at node S as a high logic level. Inverters I1, I2, and I3 invert and delay the signal at node S and generate the sub high voltage detecting signal VPPS having, e.g., a low logic level.

Alternatively, the level drop of the high voltage VPP applied to the gates of NMOS transistors N1 and N3 increases the resistance values of resistances R2 and R4. The sum of the resistance values by both R2 and R4 are increased more than that by R4 alone, decreasing the voltage at node S. The inverter I1 can recognize the generated voltage at node S as a low logic level. Inverters I1, I2, and I3 reverse and delay the signal at node S and generate the sub high voltage detecting signal VPPS having, e.g., a high logic level.

The sub high voltage detector 10 generates the sub high voltage detecting signal VPPS having a low logic level where the high voltage VPP is maintained at the high voltage level in the active mode. Alternatively, the sub high voltage detector 10 generates the sub high voltage detecting signal VPPS having a high logic level where the level drop of the high voltage VPP occurs in the active mode.

Figure 3:
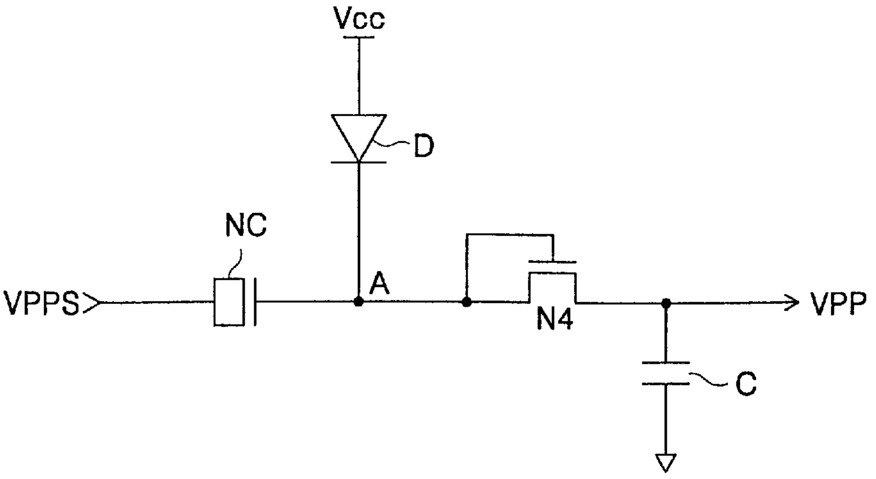
FIG. 3 is a circuit diagram of the sub high voltage generator shown in FIG. 1.

FIG. 3 is a circuit diagram illustrating a sub high voltage generator 12 shown in FIG. 1. The sub high voltage generator 12 comprises a NMOS capacitor NC, a diode D, a NMOS transistor N4, and a capacitor C.

The sub high voltage generator 12 operates as follows. In a standby mode, the node A is pre-charged by the voltage VCC bringing node A to a level VCC-0.7V because of the 0.7V drop from the diode D. Transition of the signal VPPS to a high logic level in the active mode boosts the voltage at node A to the voltage of 2VCC-0.7V level. The high voltage 2VCC-0.7V at node A outputs to the terminal of the high voltage generator through the diode formed from NMOS transistor N4.

In the standby mode, the sub high voltage generator 12 of FIG. 3 pre-charges the node A a voltage level of VCC-0.7V because the signal VPPS is at a low logic level, and outputs the voltage charged in the capacitor C to the terminal of the high voltage generator 12. In the active mode, transition of the signal VPPS to a high logic level boosts the voltage at node A to the voltage of 2VCC-0.7V, and the boosted voltage outputs to the terminal of the high voltage generator 12 though the NMOS transistor N4.

Figure 4:
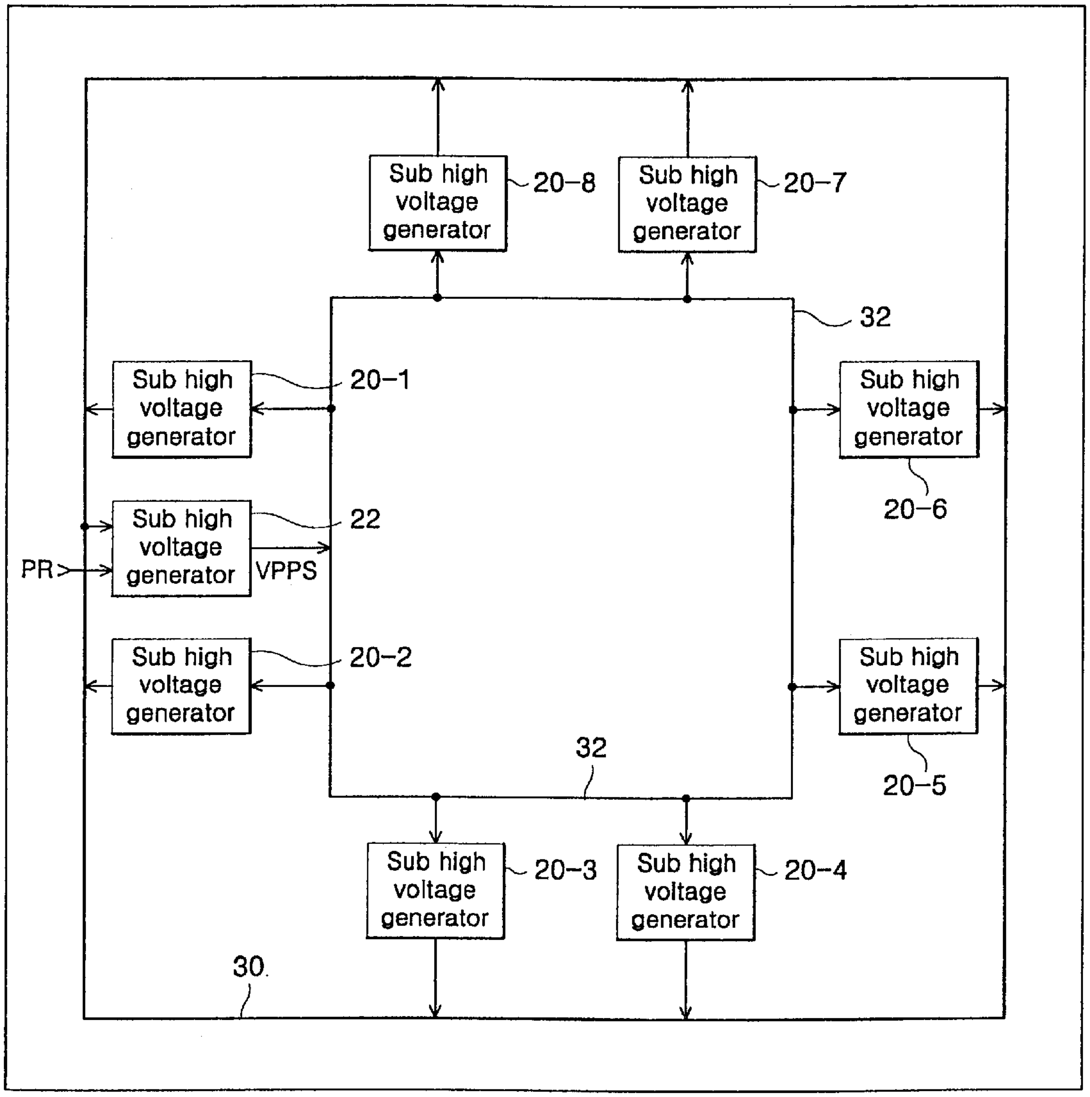
FIG. 4 is a block diagram of the sub high voltage generator shown in FIG. 1.

FIG. 4 is a block diagram of an embodiment of a sub high voltage generator in a semiconductor memory device. The sub high voltage generator comprises sub high voltage generators 20-1 to 20-8, and a sub high voltage detector 22. The line 30 represents the generated high voltage VPP, and the line 32 represents the generated sub high voltage detecting signal VPPS. The active signal PR is a signal generated internal to the semiconductor memory device while enabling a word line.

The sub high voltage generator shown in FIG. 4 is a sub high voltage generator comprising two main high voltage generators (not shown in FIG. 4) in the inside of the sub high voltage generator, eight sub high voltage generators 20-1 to 20-8, and a sub high voltage detector 22. In the above case, all of these generators and a detector are arranged in the peripheral area of memory cell array (not shown in FIG. 4).

The sub high voltage detector 22, enabled in response to the active signal PR, generates the sub high voltage detecting signal VPPS by detecting the level drop of the high voltage VPP. The sub high voltage generators 20-1 to 20-8 boost the high voltage VPP responsive to the sub high voltage detecting signal VPPS.

As the detail descriptions in the above statements, the semiconductor memory device operates the entire eight sub high voltage generators 20-1 to 20-8 in responsive to the sub high voltage detecting signal VPPS and compensates the level drop of the high voltage VPP. However, the semiconductor memory device operates not only two main high voltage generators (not shown in FIG. 4), but the entire eight sub high voltage generators 20-1 to 20-8 so that electric charges can be oversupplied to the high voltage generating line 30 in the test mode. As a result, over kill of the semiconductor memory device can occur.

Another test mode in the package state for the semiconductor memory device operates fewer sub high voltage generators than those necessary in the test mode described above. The semiconductor memory device, however, cannot enable and disable the signals in each of the sub high voltage generators. Put differently, the device shown in FIG. 4.

Figure 5:
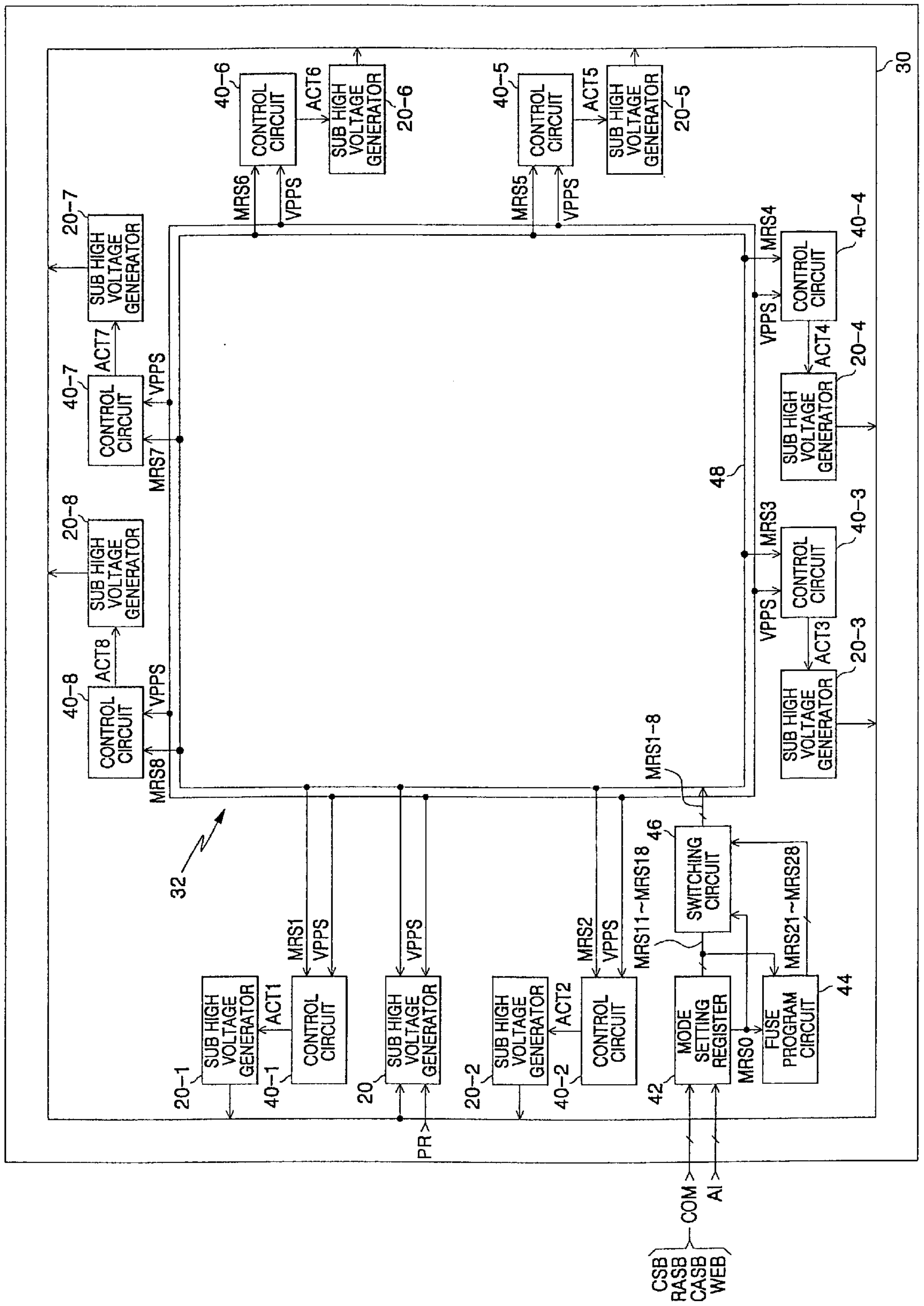
FIG. 5 is a block diagram of a high voltage generator according to an embodiment of the present invention.

FIG. 5 is a block diagram of a high voltage generator according to an embodiment of the present invention. The high voltage generator comprises control circuits 40-1 to 40-8, a mode setting register 42, a fuse program circuit 44, and a switching circuit 46 in addition to the other circuits and signals (e.g., active signal PR and the high voltage detecting signal VPPS) included in the high voltage generator shown and described in FIG. 4. The active signal PR is input to the sub high voltage detector 22. The high voltage detecting signal is generated by the sub high voltage detector 22 and input to the control circuits 40-1 through 40-8.

The signal line 48 represents the mode register setting signal MRS. Even though the MRS signal line 48 is shown as only one line, the MRS signal line expresses the eight signals MRS11 to MRS18, and the eight signals MRS21 to MRS28 from both the switching circuit 46 and the fuse program circuit 44.

The mode setting register 42 receives data Ai from address pins (not shown) and controls the operation mode of the semiconductor memory device. An order signal COM includes an inverting chip selecting signal CSB, an inverting row address strobe signal RASB, an inverting column address strobe signal CASB, and an inverting write enable signal WEB. In other words, varying a data signal Ai applied from the mode setting register 42 generates the control signals MRS0 and MRS11 to MRS18 in the test mode. In addition, the mode setting register 42 generates the control signals MRS0 and MRS11 to MRS18 enabling only predetermined numbers of sub high voltage generators necessary in the normal mode.

Each of the control circuits 40-1 to 40-8 enables each of a corresponding active signals ACT1 to ACT8 operating each of the corresponding sub high voltage generators 20-1 to 20-8, responsive to the corresponding sub high voltage detecting signal VPPS. Each of the control circuits 40-1 to 40-8 also disables each of the corresponding active signals ACT1 to ACT8 responsive to each of the corresponding control signals MRS1 to MRS8.

The fuse program circuit 30 generates the control signals MRS21 to MRS28 responsive to each of the corresponding signals MRS11 to MRS18. The fuse program circuit additionally operates responsive to the mode signal MRS0 generated by the mode setting register 42. The control signals MRS1 to MRS8 take the form of either control signals MRS11 to MRS18 or control signals MRS21 to MRS28 responsive to mode signal MRS0.

The semiconductor memory device shown in FIG. 5 operates as follows. The control signals MRS0 and MRS11 to MRS18 are generated by both receiving the data Ai to determine the states of the control signals MRS1 to MRS0 and applying the order signals COM of "low" logic level to the mode setting register 42 in the test mode. The data signal Ai makes the control signal MRS0 be in a logic low level. The switching circuit 46, enabled responsive to the logic low level control signal MRS0, transmits the control signals MRS11 to MRS18 to the MRS signal line 48. In other words, varying the date of the control signals MRS11 to MRS18 responsive to the externally-rceived data signal Ai determines the number of sub high voltage generators 20-1 to 20-8 not only necessary and operative in the test mode, but also necessary and operative in the normal mode.

In addition, the semiconductor memory device according to the present invention might enable any number of the sub high voltage generators less than that in the test mode of the package state.

When a predetermined number of the sub high voltage generator 20-1 to 20-8 necessary in the normal mode is fixed during the test mode, a logic low level the order signal COM is applied to the mode setting register 42 for setting the mode. Inputting the data signal Ai determining states of the control signals MRS0 to MRS8 programs the state of the control signals MRS0, MRS11 to MRS18. In this case, the data signal Ai makes the control signal MRS0 be in a logic high level. The switching circuit 46 is turned off and the fuse program circuit 44 fixes a state of the control signals MRS21 to MRS28 responsive to the control signals MRS11 to MRS18 from the mode setting register 42. Therefore, the enable/disable states of the sub high voltage generator 20-1 to 20-8 are fixed.

Figure 6:
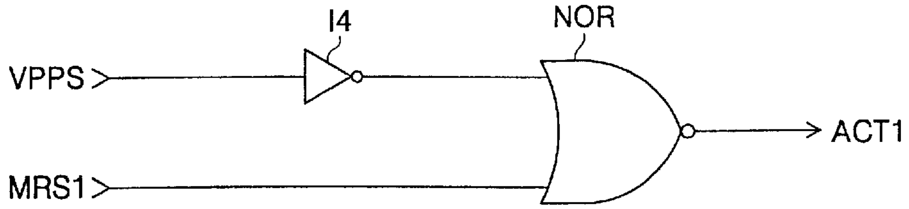
FIG. 6 is a circuit diagram of the control circuit shown in FIG. 5.

FIG. 6 is a circuit diagram of the control circuit shown in FIG. 5. The control circuit comprises an inverter I4 serially connected to a NOR gate NOR. Inverter I4 inverts the high voltage signal CPPS. The NOR gate NOR logically manipulates the inverted signal CPPS and the control signal MRS1. If the signal MRS1 is in a logic low level, the NOR gate NOR generates a logic high level control signal ACT1. If the signal MRS1 is in a logic high level and the high voltage detecting signal VPPS is in a logic high level, the NOR gate generates a logic low level control signal ACT1.

The control circuit in FIG. 6 enables the control signal ACT1 when the control signal MRS1 is in a logic low level and the sub high voltage detecting signal VPPS is in a logic high level. Conversely, the control circuit in FIG. 6 disables the control signal ACT1 regardless of the state of the sub high voltage detecting signal VPPS when the control signal MRS1 is in a logic high level.

Figure 7:
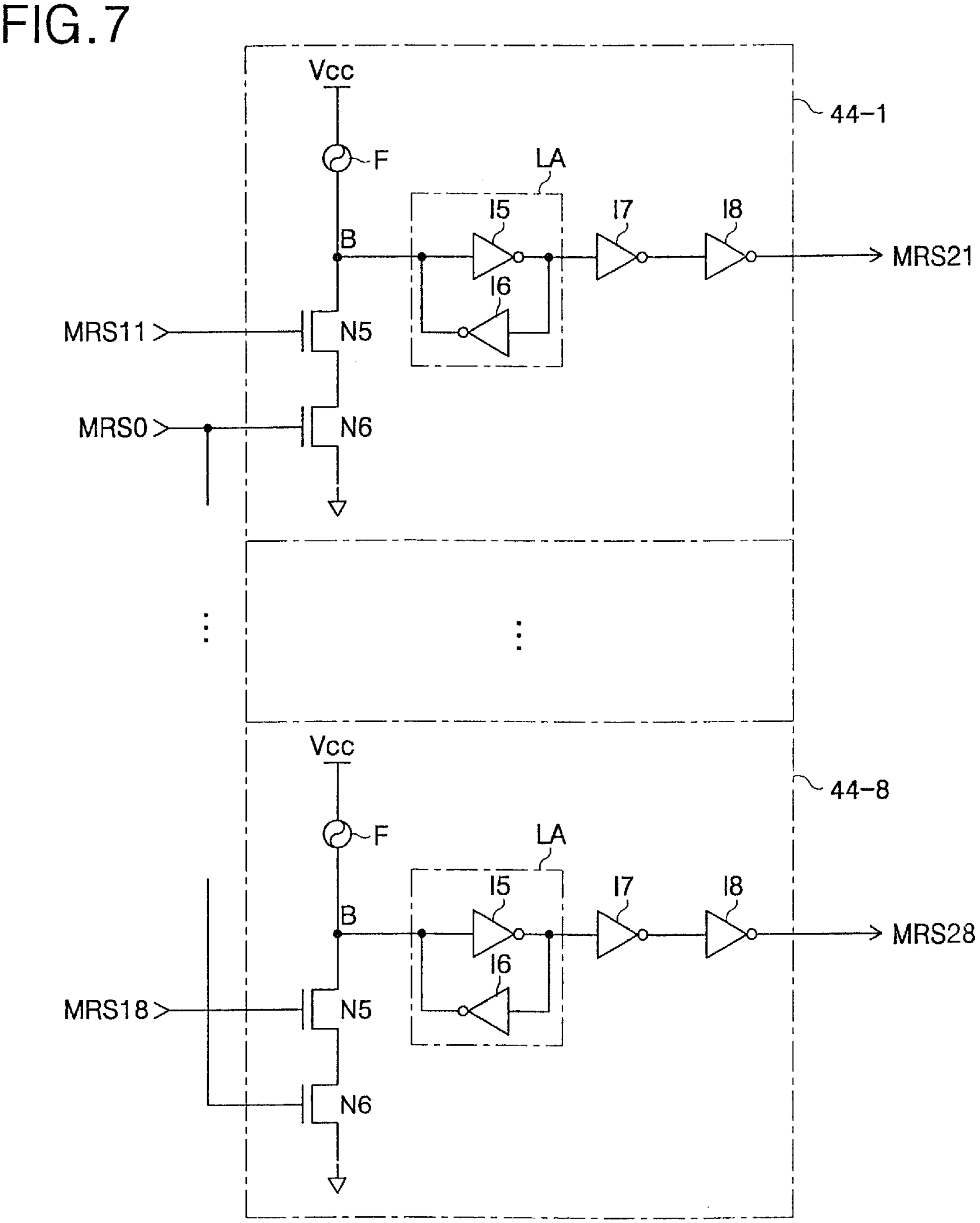
FIG. 7 is a circuit diagram of the fuse program circuit shown in FIG. 5.

FIG. 7 is a circuit diagram of one of the fuse program circuits shown in FIG. 5. The fuse program circuit comprises eight fuse circuits 44-1 to 44-8, each identical in structure to that shown in FIG. 7. For simplicity, only fuse circuit 44-1 will be explained. The fuse circuit 44-1 includes a fuse F, NMOS transistors N5 and N6, a latch LA comprising inverters I5 and I6, and inverters I7 and I8.

The fuse circuit 44-1 operates as follows. Applying a logic high level control signal MRS0 turns on the NMOS transistor N6. Applying a logic high level control signal MRS11 turns on the NMOS transistor N5. As a result, a current flow to a node B through the fuse F cuts off the fuse F, which results in a logic low level at node B. The latch LA comprises inverters I5 and I6. The latch LA latches and inverts the logic low signal at node B. Inverters I7 and I8 buffer the signal output from the latch LA to thereby generate a logic high level control signal MRS21.

On the other hand, applying a logic high level control signal MRS0 turns on the NMOS transistor N6. Applying a logic low level control signal MRS0 turns off the NMOS transistor N5 resulting in the fuse F not being cut off and maintaining the node B at a logic high level. The latch LA inverts and latches the signal at node B. Inverters I7 and I8 buffer the signal output from the latch LA to thereby generate a logic low level control signal MRS21.

Therefore, the states of the control signals MRS21 to MRS28 is determined by programming each of the fuse circuits 44-1 to 44-8 is responsive to the control signals MRS0, MRS11 to MRS18.

The fuse program circuit in the semiconductor memory device according to the present invention shown in FIG. 5 is for programming and determining the number of the sub high voltage generators necessary in the normal mode. The number of sub high voltage generators necessary in the normal mode is determined in the test mode.

When the semiconductor memory device does not possess the fuse program circuit, only the number of the sub high voltage generator necessary in both the test and the normal mode can be determined. A design process for the semiconductor memory device can comprise the configuration of the optimized number of the sub high voltage generators necessary in both the test mode and the normal mode by reflecting the above facts. The embodiment according to the present invention shown in FIG. 5 comprises the fuse program circuit. A person of skill in the art should recognize that an alternative embodiment of the present invention might not include the fuse program circuit.

The present invention can be applied not only to the high voltage generator but to other voltage generators included in semiconductor memory devices, for example, an internal voltage generator, an substrate voltage generator, and a bit line pre-charge voltage generator, and the like. In other words, the above-described method according to the present invention can enable only the number of voltage generators necessary in the normal mode while the test mode of the package state is performed.

The semiconductor memory device and the voltage level control method for such a semiconductor memory device according to the present invention can perform the test in the state of controlling the number of the voltage generators enabled in the test mode, which results in preventing over kill of the semiconductor memory device. In addition, the test of the package state can be performed by enabling fewer of the voltage generators than necessary for the full operation of the test mode.

Further, the semiconductor memory device and the voltage level control method for such a semiconductor memory device according to the present invention can program to enable the optimized voltage generators necessary in the normal mode while the test in the package state is performed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:

a plurality of sub high voltage generators connected to receive a corresponding plurality of control signals, each sub high voltage generator for boosting a high voltage responsive to the corresponding control signal;

a plurality of control circuits, each control circuit coupled to a corresponding sub high voltage generator for generating the corresponding control signal responsive to a high voltage detecting signal and a corresponding mode signals in a test mode;

a high voltage level detect circuit for generating the high voltage detect signal responsive to detecting a high voltage level drop; and a mode setting circuit for generating a plurality of the corresponding mode signals responsive to external signals in the test mode.

2. The semiconductor memory device of claim 1, comprising:

a fuse program circuit coupled to the mode setting circuit for setting a state of the plurality of mode signals responsive to one of the plurality of mode signals.

3. The semiconductor memory device of claim 1 wherein each control circuit disables the corresponding sub high voltage generator responsive to the corresponding control signal and enables the corresponding sub high voltage generator responsive to the high voltage detecting signal.

4. The semiconductor memory device of claim 2 wherein the fuse program circuit comprises a plurality of fuse circuits, each fuse circuit comprising:

a fuse connected between a power voltage and a node;

a first NMOS transistor having a gate, a drain, and a source, the gate receiving a corresponding control signal and the drain being connected to the node;

a second NMOS transistor having a gate, a drain, and a source, the gate receiving the mode select signal, the drain being connected to the source of the first NMOS transistor, and the source being connected to a ground voltage;

a latch coupled to the node for inverting and latching a signal at the node; and at least two buffers coupled to the latch for buffering the latched node signal.

5. A semiconductor memory device, comprising:

a plurality of voltage generators connected to boost a voltage level;

a plurality of control circuits coupled to the plurality of voltage generators, each control circuit controlling a corresponding voltage generator responsive to a voltage detect signal and a corresponding mode signal;

a voltage detect circuit for generating the voltage detect signal responsive to detecting a level drop in the voltage; and a mode setting circuit coupled to the plurality of control circuits for generating the plurality of mode signals and a mode signal responsive to an address signal and an external signal.

6. The semiconductor memory device of claim 5 comprising:

a fuse program circuit coupled to the mode setting circuit for setting a state of each of the mode signals responsive to the mode signal.

7. The semiconductor memory device of claim 5 wherein each of the plurality of control circuits disables a corresponding voltage generator responsive to a corresponding mode signal generated by the mode setting circuit; and wherein each of the plurality of control circuits enables the corresponding voltage generator responsive to the voltage detect signal.

8. The semiconductor memory device according to claim 6, wherein the fuse program circuit includes a plurality of fuse circuits, each fuse circuit comprising:

a fuse connected between a power voltage and a node;

a first NMOS transistor having a gate, a drain, and a source, the gate receiving a corresponding control signal and the drain being connected to the node;

a second NMOS transistor having a gate, a drain, and a source, the gate receiving the mode select signal, the drain being connected to the source of the first NMOS transistor, and the source being connected to a ground voltage;

a latch coupled to the node for inverting and latching a signal at the node; and at least two buffers coupled to the latch for buffering the latched node signal.

9. A method for boosting a voltage in a semiconductor memory device including a plurality of voltage generators, comprising:

generating a plurality of mode signals corresponding to a plurality of voltage generators from a mode setting circuit in a test mode; and enabling the plurality of voltage generators responsive to the plurality of mode signals.

10. The method of claim 9 comprising:

fixing a state of,the plurality of mode signals responsive to a predetermined number of the plurality of voltage generators necessary in a normal mode.

* * * * *

UNITED STATES PATENT AND TRADEMARK OFFICE

CERTIFICATE OF CORRECTION

PATENT NO. : 6,535,447 B2
DATED : March 18, 2003
INVENTOR(S) : Kim et al.

It is certified that error appears in the above-identified patent and that said Letters Patent is hereby corrected as shown below:

Column 6,
Line 9, “MRS1 to MRS0” should read -- MRS1 to MRS8 --.

Column 10,
Line 3, “state of, the” should read -- state of the --.

Signed and Sealed this

Ninth Day of December, 2003

JAMES E. ROGAN
*Director of the United States Patent and Trademark Office*